United States Patent
Su (10) Patent No.: US 12,133,370 B2
(45) Date of Patent: Oct. 29, 2024

(54) SHIELDING FILM AND CIRCUIT BOARD

(71) Applicant: GUANGZHOU FANGBANG ELECTRONICS CO., LTD, Guangdong (CN)

(72) Inventor: Zhi Su, Guangdong (CN)

(73) Assignee: GUANGZHOU FANGBANG ELECTRONICS CO., LTD, Guangdong (CN)

( * ) Notice: Subject to any disclaimer, the term of this patent is extended or adjusted under 35 U.S.C. 154(b) by 0 days.

(21) Appl. No.: 18/006,472

(22) PCT Filed: Sep. 10, 2020

(86) PCT No.: PCT/CN2020/114440
§ 371 (c)(1),
(2) Date: Jan. 23, 2023

(87) PCT Pub. No.: WO2022/016687
PCT Pub. Date: Jan. 27, 2022

(65) Prior Publication Data
US 2023/0276604 A1    Aug. 31, 2023

(30) Foreign Application Priority Data
Jul. 24, 2020   (CN) .......................... 202010725896.5

(51) Int. Cl.
*H05K 9/00* (2006.01)
*H05K 1/02* (2006.01)

(52) U.S. Cl.
CPC ......... *H05K 9/0088* (2013.01); *H05K 1/0224* (2013.01); *H05K 9/0086* (2013.01)

(58) Field of Classification Search
CPC .......................... H05K 9/0088; H05K 9/0094
See application file for complete search history.

(56) References Cited

U.S. PATENT DOCUMENTS

| | | | |
|---|---|---|---|
| 8,262,239 B2 * | 9/2012 | Park | G02B 1/10 348/820 |
| 2006/0088690 A1 * | 4/2006 | Arakawa | B32B 27/08 428/138 |

(Continued)

FOREIGN PATENT DOCUMENTS

| CN | 101290533 A | 10/2008 |
|---|---|---|
| CN | 101513782 A | 8/2009 |

(Continued)

OTHER PUBLICATIONS

International Search Report for PCT/CN2020/114440, mailed May 8, 2021, 3 Pages.

(Continued)

*Primary Examiner* — Hung V Ngo
(74) *Attorney, Agent, or Firm* — Riverside Law LLP (57) ABSTRACT

A shielding film and a circuit board are provided. The shielding film includes a first film layer (11), a contrast structural layer (12) and an electromagnetic shielding layer (13). The first film layer (11) is disposed on a first side of the electromagnetic shielding layer (13). The contrast structural layer (12) is disposed on the first side of the electromagnetic shielding layer (13). The grayscale value of the color of the contrast structural layer (12) is greater than the grayscale value of the color of the first film layer (11). In the contrast structural layer (12) and the first film layer (11), a hollowed-out pattern of an identification code is formed on a layer away from the electromagnetic shielding layer (13).

20 Claims, 4 Drawing Sheets

(56) References Cited

U.S. PATENT DOCUMENTS

| | | | | |
|---|---|---|---|---|
| 2006/0194020 | A1* | 8/2006 | Naito | H05K 9/0096 |
| | | | | 428/457 |
| 2007/0188066 | A1* | 8/2007 | Arakawa | H05K 9/0096 |
| | | | | 313/238 |
| 2008/0266831 | A1* | 10/2008 | Hwang | H05K 9/0096 |
| | | | | 361/818 |
| 2009/0133922 | A1* | 5/2009 | Okazaki | H05K 9/0096 |
| | | | | 428/209 |
| 2009/0310212 | A1* | 12/2009 | Shin | G02B 5/22 |
| | | | | 359/359 |
| 2010/0175913 | A1 | 7/2010 | Ishigaki | |
| 2015/0201535 | A1* | 7/2015 | Su | H05K 9/0084 |
| | | | | 156/251 |
| 2016/0044839 | A1 | 2/2016 | Akahane | |
| 2020/0413577 | A1* | 12/2020 | Su | H05K 9/0075 |

FOREIGN PATENT DOCUMENTS

| | | | |
|---|---|---|---|
| CN | 102711426 | A | 10/2012 |
| CN | 205454368 | U | 8/2016 |
| CN | 206506768 | U | 9/2017 |
| CN | 108323143 | A | 7/2018 |
| CN | 207885103 | U | 9/2018 |
| EP | 0771677 | A1 | 5/1997 |
| JP | H09123606 | A | 5/1997 |
| JP | 2005286326 | | 10/2005 |
| JP | 2010161302 | A | 7/2010 |
| JP | 2012124465 | A | 6/2012 |
| JP | 2016039160 | | 3/2016 |
| JP | 2019186438 | A | 10/2019 |
| JP | 2019220620 | | 12/2019 |

OTHER PUBLICATIONS

Japanese Office Action for Application No. 2023-504656, mailed Feb. 7, 2024, 5 pages.
Korean Office Action for Application No. 10-2023-7005949, mailed Jul. 16, 2024, 10 Pages.

* cited by examiner

SHIELDING FILM AND CIRCUIT BOARD

CROSS-REFERENCE TO RELATED APPLICATIONS

The present disclosure is a national stage application of International Patent Application No. PCT/CN2020/114440, which was filed Sep. 10, 2020, and claims priority to Chinese Patent Application No. 202010725896.5, filed Jul. 24, 2020, the contents of each of which are hereby incorporated by reference in their entirety.

TECHNICAL FIELD

The present disclosure relates to the technical field of electronics, for example, to a shielding film and a circuit board.

BACKGROUND

With the rapid development of electronic industry, electronic products are further miniaturized, lightweight and densely assembled, thereby greatly promoting the development of a flexible circuit board, and gradually realizing the integrated connection of component devices and wires. The flexible circuit board may be widely applied in mobile phone, liquid crystal display, communication and aerospace industries.

With the integration of various functions of electronic products such as mobile phones, internal components of mobile phones are gradually high-frequency and high-speed. For example, among various functions of mobile phones, in addition to an original audio propagation function, a camera function has become an essential function, and Wireless Local Area Networks (WLAN), Global Positioning System (GPS) and Internet access functions have also been popularized. Furthermore, future sensing components will be gradually integrated, and the trend of sharp high frequency and high speed for internal components of mobile phones is inevitable.

In a current electronic product, various components are integrated inside the electronic product. In order to better trace the electronic product or better trace a certain component inside the electronic product, an identification code is often provided in the electronic product, and information of the electronic product or a certain component inside the electronic product may be traced by scanning the identification code. In an art known to inventors, an identification code (e.g. a QR code) is printed on a steel plate, but it is difficult to print the QR code on the steel plate because the size of the steel plate is limited by the lighter and thinner of the electronic product. It is also possible in the art to print the identification code on a flexible printed circuit of the electronic product by means of printing. However, due to the small size of the flexible printed circuit, the printed identification code is unclear, the precision fails to meet the identification requirements, and there are also cases where the marking code cannot be printed on the flexible printed circuit with a small size.

SUMMARY

Embodiments of the present disclosure provide a shielding film and a circuit board, so as to provide an identification code on the shielding film, thus improving the clarity and resolution of the identification code.

According to a first aspect, an embodiment of the present disclosure provides a shielding film, which includes: a first film layer, a contrast structural layer and an electromagnetic shielding layer.

The first film layer is disposed on a first side of the electromagnetic shielding layer.

The contrast structural layer is disposed on the first side of the electromagnetic shielding layer.

The grayscale value of the color of the contrast structural layer is greater than the grayscale value of the color of the first film layer.

According to a second aspect, an embodiment of the present disclosure provides a shielding film, which includes: a first film layer, a contrast structural layer and an electromagnetic shielding layer.

The first film layer is disposed on a first side of the electromagnetic shielding layer.

The contrast structural layer is disposed on the first side of the electromagnetic shielding layer.

The grayscale value of the color of the contrast structural layer is greater than the grayscale value of the color of the first film layer, and in the contrast structural layer and the first film layer, a hollowed-out pattern of an identification code is formed on the layer away from the electromagnetic shielding layer.

According to a third aspect, an embodiment of the present disclosure provides a circuit board, which includes: a printed circuit board and a shielding film provided by any embodiment of the present disclosure. An adhesive film layer is disposed on the side of an electromagnetic shielding layer of the shielding film away from the first film layer.

The side of the adhesive film layer of the shielding film is attached to the printed circuit board.

In some embodiments of the present disclosure, a shielding film includes an electromagnetic shielding layer for shielding EMI. A first film layer and a contrast structural layer are disposed on a first side of the electromagnetic shielding layer. The first film layer may be disposed between the electromagnetic shielding layer and the contrast structural layer, or the contrast structural layer may be disposed between the electromagnetic shielding layer and the first film layer. The grayscale value of the color of the contrast structural layer is required to be greater than the grayscale value of the color of the first film layer, so that an obvious brightness contrast of light and shade can be formed between the contrast structural layer and the first film layer. In this embodiment, a hollowed-out pattern of an identification code is formed on the layer further away from the electromagnetic shielding layer in the contrast structural layer and the first film layer. Therefore, under the strong contrast of light and shade or colors between the contrast structural layer and the first film layer of the shielding film, a user can acquire an identification code with a higher definition, so that the identification code recognition precision and accuracy are improved, and a component or an electronic product identified by the identification code is easily traced.

DETAILED DESCRIPTION OF THE EMBODIMENTS

The present disclosure will be further described in detail below with reference to the accompanying drawings and embodiments. It will be appreciated that the specific embodiments described herein are merely illustrative of the present disclosure and are not intended to limit the present disclosure. Furthermore, it is also to be noted that, for the convenience of description, only some, but not all, of the structures related to the present disclosure are shown in the drawings.

With the development of flexible circuit boards, an important indicator for assessing the performance of flexible circuit boards is EMI shielding (Electromagnetic Interference Shielding). EMI inside and outside components caused by high-frequency and high-speed driving, and signal attenuation, insertion loss and jitter in the transmission process gradually become serious. For a common electronic product, it is necessary to attach a shielding film to a printed circuit board to achieve EMI shielding. In the current situation where an identification code is difficult to be set due to the dimension and specification of the electronic product, according to the embodiments of the present disclosure, the identification code is creatively set on the shielding film so as to improve the clarity and resolution of the identification code.

Specifically, an embodiment of the present disclosure provides a shielding film, including: a first film layer, a contrast structural layer and an electromagnetic shielding layer.

The first film layer is disposed on a first side of the electromagnetic shielding layer.

The contrast structural layer is disposed on the first side of the electromagnetic shielding layer.

The grayscale value of the color of the contrast structural layer is greater than the grayscale value of the color of the first film layer.

In the embodiment of the present disclosure, the grayscale value of the color of the contrast structural layer is greater than the grayscale value of the color of the first film layer, provided that after forming the identification code, the device can identify the colors of the two layers and further process to form a clear and recognizable identification code, and there is no limitation on the difference between the grayscale value of the color of the contrast structural layer and the grayscale value of the color of the first film layer.

In the embodiment of the present disclosure, a shielding film includes an electromagnetic shielding layer for shielding electromagnetic interference (i.e. EMI). A first film layer and a contrast structural layer are disposed on a first side of the electromagnetic shielding layer. The first film layer may be disposed between the electromagnetic shielding layer and the contrast structural layer, or the contrast structural layer may be disposed between the electromagnetic shielding layer and the first film layer. The grayscale value of the color of the contrast structural layer is required to be greater than the grayscale value of the color of the first film layer, so that an obvious brightness contrast of light and shade is formed between the contrast structural layer and the first film layer. In this embodiment, a hollowed-out pattern of an identification code is formed on the layer away from the electromagnetic shielding layer in the contrast structural layer and the first film layer. Therefore, under the strong contrast of light and shade or colors between the contrast structural layer and the first film layer of the shielding film, a user can acquire an identification code with a higher definition, so that the identification code recognition precision and accuracy are improved, and a component or an electronic product identified by the identification code is easily traced.

The above is the core idea of the present disclosure. The technical solutions in the embodiments of the present disclosure will now be described clearly and completely hereinafter with reference to the accompanying drawings in the embodiments of the present disclosure. All other embodiments obtained by those of ordinary skill in the art based on the embodiments in the present disclosure without creative work fall within the scope of protection of the present disclosure.

Figure 1:
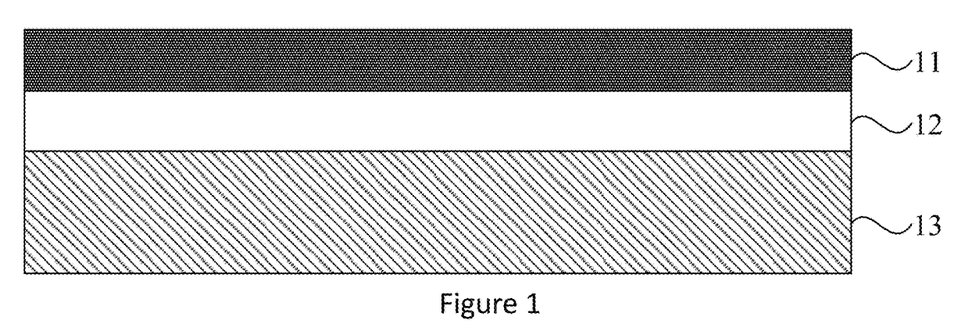
FIG. 1 is a schematic structural diagram of a shielding film according to an embodiment of the present disclosure.
Figure 2:
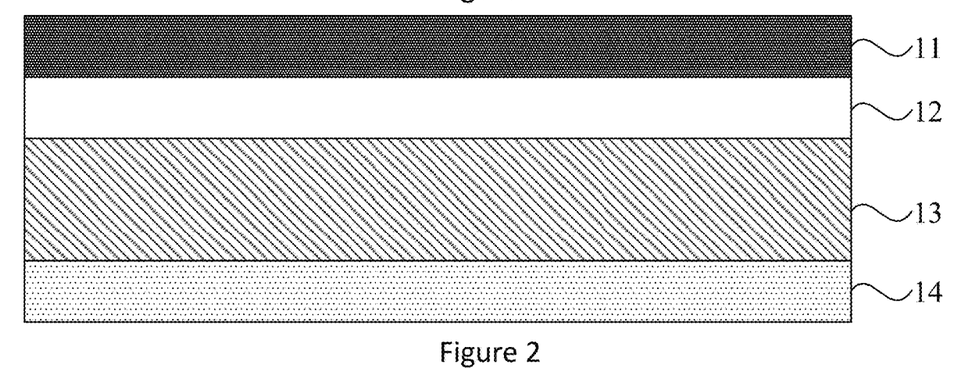
FIG. 2 is a schematic structural diagram of another shielding film according to an embodiment of the present disclosure.

FIG. 1 is a schematic structural diagram of a shielding film according to an embodiment of the present disclosure. As shown in FIG. 1, the shielding film includes a first film layer 11, a contrast structural layer 12 and an electromagnetic shielding layer 13. The material of the electromagnetic shielding layer 13 is a conductive material with good shielding performance, which can achieve effective EMI shielding. In some embodiments, the material of the electromagnetic shielding layer 13 is copper, which has good electrical characteristics, high shielding performance, high transmission quality, good reliability, and other characteristics while ensuring a relatively low cost. Definitely, the material of the electromagnetic shielding layer 13 may also be a metal material such as aluminum and silver. This is not limited in this embodiment. In some embodiments, as shown in FIG. 2, FIG. 2 is a schematic structural diagram of a shielding film according to an embodiment of the present disclosure. The shielding film further includes an adhesive film layer 14. The adhesive film layer 14 is disposed on the side of the electromagnetic shielding layer 13 further away from the first film layer 11 and configured to realize connection between the electromagnetic shielding layer 13 and a circuit board.

The first film layer 11 is configured to insulate and support the electromagnetic shielding layer 13 so as to block the invasion of water and oxygen to the electromagnetic shielding layer 13 to a certain extent. In some embodiments, the first film layer 11 is black, or a color with a grayscale value, such as dark blue, closer to black. However, this embodiment does not define the specific color of the first film layer 11. In some embodiments, the first film layer 11 includes at least one of epoxy resin, rubber, modified epoxy resin, polyimide, polyurethane-based resin, acrylic resin, modified acrylic resin, polyester, polyphenylene sulfide, polyethylene terephthalate, liquid crystal polymer, and ink. At least one of the above materials is mixed to form a dark color with a low grayscale value by adding other materials in this embodiment.

In some embodiments, the color of the first film layer 11 is black. The first film layer 11 may include at least one of black polyimide and black ink. The black polyimide has a good moisture barrier effect, and the black ink has a strong flame retardant effect. The first film layer 11 may be provided with a black polyimide material or may be provided with a black ink material. In some embodiments, the first film layer 11 includes both black polyimide and black ink to enhance the protective effect on the electromagnetic shielding layer 13. In some embodiments, in order to adapt to the trend of thinness of electronic products, the first film layer 11 has a thickness in the range of 0.5 µm-40 µm, so as to reduce the thickness of the first film layer 11 as much as possible. In some embodiments, the thickness of the first film layer 11 may be selected to be 4 µm, and the thinning of the first film layer 11 can be achieved under the premise of having good insulation and protection performances.

The contrast structural layer 12 is configured to form an obvious color or brightness difference with the first film layer 11, and the grayscale value of the color of the contrast structural layer 12 is greater than the grayscale value of the color of the first film layer 11. In this embodiment, grayscale parameters are used to convert the color to high-quality grayscale shades to detect the brightness contrast of the contrast structural layer 12 and the first film layer 11. Grayscale uses black tone to represent various colors, i.e. black is used as a reference color, and different colors are displayed with black of different saturation. 0-255 grayscales are divided between black and white. The grayscale value of white is 255, and the grayscale value of black is 0. In this embodiment, it is defined that the grayscale value of the color of the contrast structural layer 12 is greater than the grayscale value of the color of the first film layer 11. In some embodiments, it may be defined that the difference between the grayscale value of the color of the contrast structural layer 12 and the grayscale value of the color of the first film layer 11 is large. For example, if the color of the contrast structural layer 12 is silver and the grayscale value of silver is larger, the silver color of the contrast structural layer 12 is in sharp contrast with the dark color of the first film layer 11.

Figure 3:
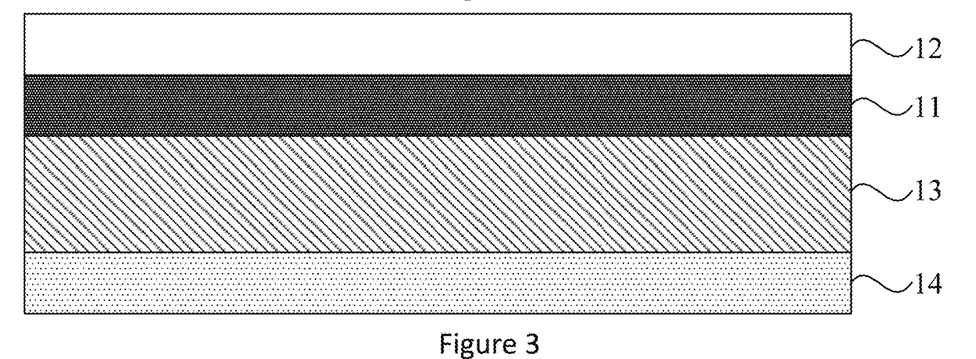
FIG. 3 is a schematic structural diagram of another shielding film according to an embodiment of the present disclosure.

The contrast structural layer 12 and the first film layer 11 are located on the same side of the electromagnetic shielding layer 13, and the contrast structural layer 12 and the first film layer 11 are disposed in a variable order. For example, as shown in FIG. 2, the contrast structural layer 12 may be disposed between the first film layer 11 and the electromagnetic shielding layer 13. Or, as shown in FIG. 3, FIG. 3 is a schematic structural diagram of another shielding film according to an embodiment of the present disclosure. The first film layer 11 is disposed between the contrast structural layer 12 and the electromagnetic shielding layer 13. It is only necessary that the contrast structural layer 12 and the first film layer 11 are superimposed on each other to form a sharp contrast. Whether the contrast structural layer 12 and the first film layer 11 are disposed in an order in FIG. 2 or in FIG. 3, the outermost layer is configured to form a hollowed-out pattern of an identification code, and the color of the other layer exposed by the hollowed-out pattern forms a greater brightness difference with the outermost layer, so that the identification code is so clear to facilitate accurate recognition by a user. Specifically, as shown in FIG. 2, when the first film layer 11 is disposed on the outermost side, a hollowed-out pattern of an identification code is formed on the first film layer 11, and the hollowed-out pattern of the first film layer 11 exposes the contrast structural layer 12 of a lighter color (a higher brightness), so as to form a clearer identification code. As shown in FIG. 3, when the contrast structural layer 12 is disposed on the outermost side, a hollowed-out pattern of an identification code needs to be formed on the contrast structural layer 12, and the hollowed-out pattern of the contrast structural layer 12 exposes the first film layer 11 of a deep color, so as to form a clearer identification code. In some embodiments, the hollowed-out pattern is formed by laser ablation. For example, the hollowed-out pattern may be ablated by using an ultraviolet laser and a carbon dioxide laser.

In some embodiments, the difference between the grayscale value of the color of the contrast structural layer 12 and the grayscale value of the color of the first film layer 11 is greater than or equal to a first grayscale threshold. If the first grayscale threshold is greater than or equal to 10, the difference between the grayscale value of the color of the contrast structural layer 12 and the grayscale value of the color of the first film layer 11 is at least 10, so that a relatively obvious difference of light and shade is formed between the contrast structural layer 12 and the first film layer 11, and the accuracy rate of recognition of the identification code formed by the contrast structural layer 12 and the first film layer 11 through an identification code recognition apparatus is improved.

In order to further increase the brightness difference between the contrast structural layer 12 and the first film layer 11, in some embodiments, the first grayscale threshold is defined as 50. Then the difference between the grayscale value of the color of the contrast structural layer 12 and the grayscale value of the color of the first film layer 11 is at least 50. The color brightness of the contrast structural layer 12 is stronger, and the color brightness of the first film layer 11 is weaker. The contrast of light and shade between the contrast structural layer 12 and the first film layer 11 is further increased, so as to improve the identification code recognition precision and accuracy.

On the basis of the above-mentioned embodiments, this embodiment may further define that the first grayscale threshold is 100, and the difference between the grayscale value of the color of the contrast structural layer 12 and the grayscale value of the color of the first film layer 11 is at least 100. For example, if the grayscale value of the color of the first film layer 11 is 0 and the difference between the grayscale value of the color of the contrast structural layer 12 and the grayscale value of the color of the first film layer 11 is at least 100 or even 255, the grayscale value of the contrast structural layer 12 may be selected to be greater than or equal to 100. In the case where the grayscale values differ by 255, one of the contrast structural layer 12 and the first film layer 11 is pure black while the other is pure white, i.e. one of the grayscale values of the two layers are 255 while the other is 0, and the brightness or color difference is large, further enhancing the clarity of the identification code.

Figure 4:
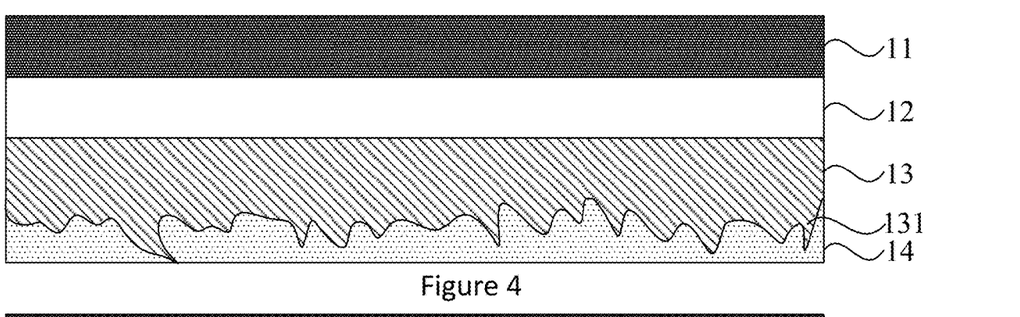
FIG. 4 is a schematic structural diagram of another shielding film according to an embodiment of the present disclosure.

It is to be noted that in this embodiment, the shielding film is attached to a printed circuit board through the side on which the adhesive film layer 14 is disposed, for rapidly guiding an interference signal generated by an electronic device from the electromagnetic shielding layer 13 to a ground plate or a ground wire of the printed circuit board. FIG. 4 is a schematic structural diagram of another shielding film according to an embodiment of the present disclosure. In the embodiments, the side of the electromagnetic shielding layer 13 close to the adhesive film layer 14 is roughened to form a plurality of protruding structures 131. The protruding structures 131 are configured to pierce the adhesive film layer 14 so as to be connected with a ground terminal of a printed circuit board. The protruding structures 131 can realize the connection between the electromagnetic shielding layer 13 and the ground terminal, and the protruding structures 131 enable the electromagnetic shielding layer 13 and the adhesive film layer 14 to be closely adhered, so as to avoid the separation of the electromagnetic shielding layer 13 and the adhesive film layer 14. Furthermore, when the amount of adhesives of the adhesive film layer 14 is insufficient, the shielding film and the printed circuit board will be separated, and when the amount of adhesives of the adhesive film layer 14 is too large, adhesives easily overflow from the edge of the printed circuit board. When the shielding film and the printed circuit board are pressed together, the arrangement of the protruding structures 131 in this embodiment makes it possible to squeeze the overflowing adhesives lifted up by the protruding structures 131 to a recessed part of the adhesive film layer 14, so as to increase the amount of adhesives contained between the electromagnetic shielding layer 13 and the printed circuit board, and to avoid peeling between the shielding film and the printed circuit board.

It is to be noted that in the production process of the above-mentioned shielding film, the first film layer 11, the contrast structural layer 12, the electromagnetic shielding layer 13 and the adhesive film layer 14 are all disposed on a carrier film, the carrier film supports the above-mentioned various film layers, and after the first film layer 11, the contrast structural layer 12 and the electromagnetic shielding layer 13 are formed on the carrier film, the electromagnetic shielding layer 13 is roughened to form the protruding structures 131, and the adhesive film layer 14 is pressed onto the protruding structures 131 of the electromagnetic shielding layer 13 to form a base film material of the shielding film. Thereafter, it is necessary to peel the base film material of the shielding film from the carrier film and ablate a hollowed-out pattern of an identification code on the side of the shielding film away from the adhesive film layer 14.

Figure 5:
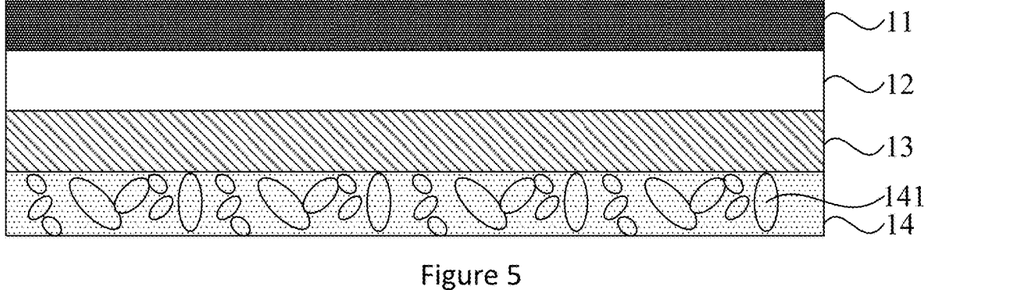
FIG. 5 is a schematic structural diagram of another shielding film according to an embodiment of the present disclosure.

FIG. 5 is a schematic structural diagram of another shielding film according to an embodiment of the present disclosure. In this embodiment, the side of the electromagnetic shielding layer 13 near the adhesive film layer 14 may be not roughened, and the adhesive film layer 14 is provided with a plurality of conductive particles 141. The conductive particles 141 are configured to pierce the adhesive film layer 14 so as to be connected with the ground terminal of the printed circuit board and the electromagnetic shielding layer 13. In comparison with FIG. 4, the adhesive film layer 14 shown in FIG. 5 includes a plurality of conductive particles 141 therein, the conductive particles 141 are agglomerated to form larger particles, and the larger particles can pierce the adhesive film layer 14 so that the ground terminal of the printed circuit board and the electromagnetic shielding layer 13 are connected. Then in the manufacturing process of this embodiment, the adhesive film layer 14 and the electromagnetic shielding layer 13 are closely adhered without roughening the electromagnetic shielding layer 13, thus forming a base film material of the shielding film.

Figure 6:
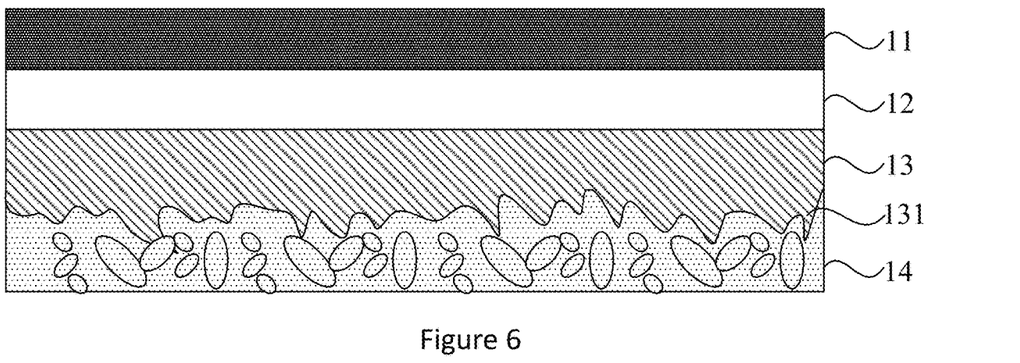
FIG. 6 is a schematic structural diagram of another shielding film according to an embodiment of the present disclosure.

In some embodiments, the side of the electromagnetic shielding layer 13 near the adhesive film layer 14 is first roughened to form protruding structures which are then coated on the adhesive film layer 14 having the conductive particles 141. As shown in FIG. 6, FIG. 6 is a schematic structural diagram of another shielding film according to an embodiment of the present disclosure. In this embodiment, while the electromagnetic shielding layer 13 is roughened to form protruding structures 131, a plurality of conductive particles 141 are disposed in the adhesive film layer 14, and the conductive particles 141 can pierce the adhesive film layer 14 and be electrically connected to the protruding structures 131. Thus, the conductivity between the electromagnetic shielding layer 14 and a ground layer of the circuit board is further enhanced, and the problem of delamination between the shielding film and the circuit board caused by insufficient amount of adhesives is solved.

Figure 7:
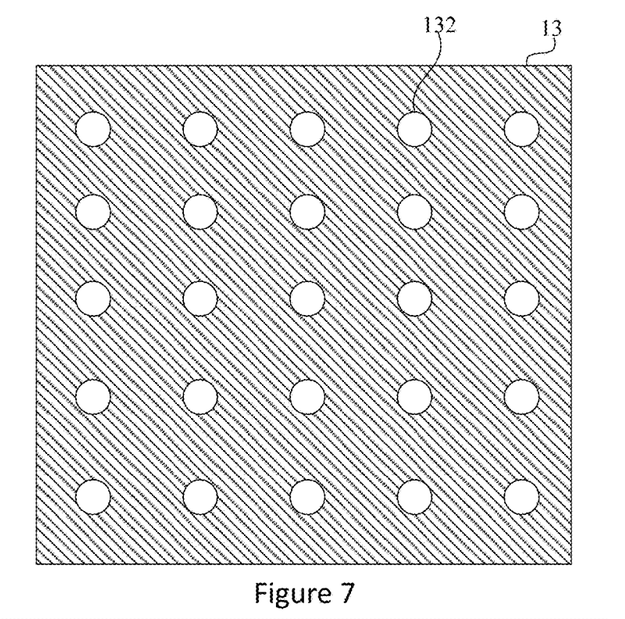
FIG. 7 is a schematic plane structure diagram of an electromagnetic shielding layer according to an embodiment of the present disclosure.

In some embodiments, as shown in FIG. 7, FIG. 7 is a schematic plane structure diagram of an electromagnetic shielding layer according to an embodiment of the present disclosure. The electromagnetic shielding layer 13 is provided with a plurality of through holes 132, so as to facilitate the venting of volatiles of the adhesive film layer at a high temperature through the through holes 132 of the electromagnetic shielding layer 13, so as to avoid the difficulty in venting volatiles of the adhesive film layer at a high temperature, thus avoiding a problem that the peeling between the electromagnetic shielding film and the ground layer of the circuit board due to bubble delamination of the electromagnetic shielding layer 13, and ensuring that the electromagnetic shielding film is grounded and the interference charge is guided away.

In some embodiments, the through holes 132 may be regularly or irregularly distributed on the electromagnetic shielding layer 13. As shown in FIG. 7, the regular distribution of the through holes 132 on the electromagnetic shielding layer 13 means that the various through holes 132 have the same shape and are uniformly distributed on the electromagnetic shielding layer 13. The irregular distribution of the through holes 132 on the electromagnetic shielding layer 13 means that the respective through holes 132 have different shapes and are randomly distributed on the electromagnetic shielding layer 13. In some embodiments, as shown in FIG. 7, the various through holes 132 have the same shape, and the various through holes 132 are uniformly distributed on the electromagnetic shielding layer 13. Furthermore, each through hole 132 may be a circular through hole, and may be a through hole of any other shape. FIG. 7 is merely illustrative of the through hole 132 being a circular through hole, but the through hole 132 of any other shape is within the protection scope of the embodiments of the present disclosure.

Hereinafter, the shielding film is described in detail in two types according to the arrangement order of the first film layer 11 and the contrast structural layer 12:

First, with continued reference to FIG. 3, in this embodiment, the contrast structural layer 12 is disposed on the side of the first film layer 11 further away from the electromagnetic shielding layer 13. The contrast structural layer 12 forms a hollowed-out pattern of an identification code. As shown in FIG. 3, the material of the contrast structural layer 12 in this embodiment can be metal. The grayscale value of the color of the metal is greater than the grayscale value of the color of the first film layer 11, and in some embodiments, the difference is greater than or equal to 10. It is to be noted that the above-mentioned metal layer may include at least one of a metal elementary substance and a metal alloy. This is not limited in this embodiment. When the contrast structural layer 12 is a metal layer, after a user forms a hollowed-out pattern on the metal layer, an insulating film is optionally disposed on the side of the metal layer further away from the electromagnetic shielding layer 13, and an opening portion is formed at a position where the insulating film corresponds to the hollowed-out pattern of the identification code so as to expose the identification code for recognition by the user, thus preventing a problem that short-circuiting occurs due to the metal layer contacts with an external electronic component. Furthermore, if the insulating film is a colorless and transparent insulating film, the insulating film is provided without the opening portion, and the identification code can be exposed for recognition by the user.

Furthermore, in some embodiments, the contrast structural layer 12 is an adhesive layer or an ink layer having the grayscale value greater than that of the first film layer 11. While protecting the electromagnetic shielding layer 13, the contrast structural layer 12 forms a clear identification code with the first film layer 11 exposed by the hollowed-out pattern. In this embodiment, the adhesive layer is a thermosetting adhesive.

In some embodiments, the contrast structural layer 12 is a white adhesive layer or a white ink layer. In this embodiment, when the contrast structural layer 12 is a white adhesive layer or a white ink layer, the grayscale value of the color of the contrast structural layer 12 is 255, while the color of the first film layer 11 is black, the grayscale value of the color of the first film layer 11 is 0, and the contrast of black and white is strong, so that a clearer identification code is easily formed. Furthermore, the adhesive layer or the ink layer may have other colors with a high grayscale value, such as gray and yellow. This is not limited in this embodiment.

Second, with continued reference to FIG. 2, the first film layer 11 is disposed on the side of the contrast structural layer 12 away from the electromagnetic shielding layer 13. The first film layer 11 forms a hollowed-out pattern of an identification code. In some embodiments, the contrast structural layer 12 is an adhesive layer or an ink layer, and the grayscale value of the color of the adhesive layer or the ink layer is greater than the grayscale value of the color of the first film layer 11, and in some embodiments, the grayscale value of the color of the adhesive layer or the ink layer is greater than or equal to 160.

In some embodiments, the contrast structural layer 12 is a white or colorless adhesive layer; or, the contrast structural layer 12 is a white ink layer. The material of the contrast structural layer 12 may be selected from at least one of modified epoxy resin, modified acrylic, modified rubber, modified thermoplastic polyimide, modified polyester, thermoplastic resin, thermosetting resin, and pressure-sensitive adhesive. In this embodiment, when the contrast structural layer 12 is a white adhesive layer or a white ink layer, the grayscale value of the color of the contrast structural layer 12 is 255, while in the embodiment the grayscale value of the color of the first film layer 11 is 0, and the contrast of black and white is strong, so that a clearer identification code is easily formed. Furthermore, the adhesive layer or the ink layer may have other colors with a high grayscale value, such as gray and yellow. This is not limited in this embodiment. It is to be noted that in some embodiments, when the contrast structural layer 12 is disposed between the first film layer 11 and the electromagnetic shielding layer 13, a colorless adhesive layer is selected as the contrast structural layer 12, and the colorless adhesive layer effectively protects the electromagnetic shielding layer 13 and prevents the electromagnetic shielding layer 13 from being exposed in the hollowed-out pattern. Moreover, the contrast structural layer 12 is colorless, so that the electromagnetic shielding layer 13 is exposed through a hollowed-out pattern. The black of the first film layer 11 likewise forms a contrast with the color of the electromagnetic shielding layer 13 to form a relatively clear identification code. If the material selected for the electromagnetic shielding layer 13 is copper, the color of the electromagnetic shielding layer 13 is red copper, which is easily distinguished from black. The copper is effectively protected by the colorless contrast structural layer 12 so as to prevent the color from being not easily distinguished from that of the first film layer 11 subsequently due to oxidization by exposure in air.

In some embodiments, the contrast structural layer 12 is also a metal layer. The grayscale value of the color of the metal is greater than the grayscale value of the color of the first film layer 11, and the grayscale value of the color of the metal is greater than or equal to 10 in some embodiments.

In some embodiments, the material of the contrast structural layer 12 is at least one elementary substance of nickel, silver, platinum, titanium, aluminum, cobalt, and chromium; or, the material of the contrast structural layer is an alloy formed by at least two of nickel, silver, platinum, titanium, aluminum, cobalt, and chromium; or, the material of the contrast structural layer is a combination of alloys formed by at least two of nickel, silver, platinum, titanium, aluminum, cobalt, and chromium. It will be readily appreciated that an identification code with a sharper contrast between black and white is preferred, and therefore the color of the metal material of the contrast structural layer 12 is required to be light. In some embodiments, a silver or silver-white metal material is provided. In this embodiment, at least one elementary substance of nickel, silver, platinum, titanium, aluminum, cobalt, and chromium is selected; or, an alloy formed by at least two of nickel, silver, platinum, titanium, aluminum, cobalt, and chromium forms the contrast structural layer 12; or, the material of the contrast structural layer is a combination of alloys formed by at least two of nickel, silver, platinum, titanium, aluminum, cobalt, and chromium. The above-mentioned materials are all white, silver or a color close to silver. As an example, nickel may be selected as the material of the contrast structural layer 12 in this embodiment, or a nickel-chromium alloy may be selected as the material of the contrast structural layer 12. Furthermore, the contrast structural layer 12 may be another light-colored metal having a low grayscale value. This is not limited in this embodiment.

Figure 8:
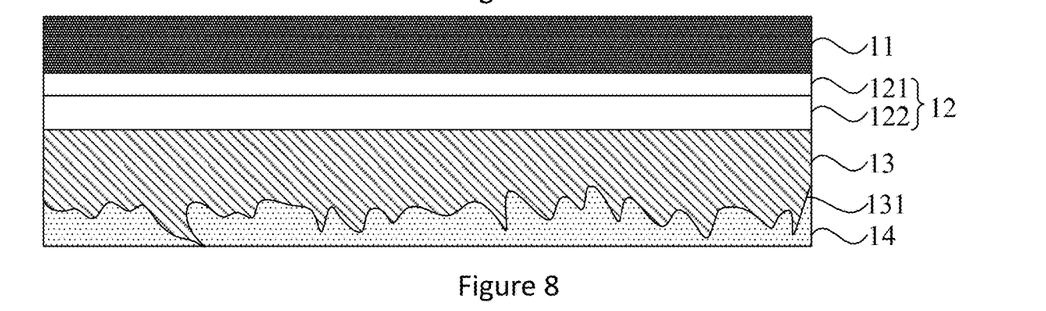
FIG. 8 is a schematic structural diagram of another shielding film according to an embodiment of the present disclosure.

FIG. 8 is a schematic structural diagram of another shielding film according to an embodiment of the present disclosure. In some embodiments, the contrast structural layer 12 includes a first metal layer 121 and a second metal layer 122. The first metal layer 121 is formed on the side of the first film layer 11 near the electromagnetic shielding layer 13 by a sputtering process. The second metal layer 122 is formed on the side of the first metal layer 121 away from the first film layer 11 by an electroplating process.

In addition to the limitation of grayscale values, this embodiment also has certain requirements for the flatness of the contrast structural layer 12. As the surface of the contrast structural layer 12 is rougher, light on the surface of the contrast structural layer 12 is darker, and the resolution with respect to the first film layer 11 is reduced. Therefore, in some embodiments, the contrast structural layer 12 is divided into two layers. That is, a first metal layer 121 is first formed on the first film layer 11 through a sputtering process, and a dense and flat metal surface is formed by the sputtering process, so as to facilitate the contrast with the first film layer 11. Then, a second metal layer 122 is formed on the flat first metal layer 121 through an electroplating process. In some embodiments, the first metal layer 121 may have a thickness in the range of 10 Å-2 μm, and the second metal layer 122 may have a thickness in the range of 0.1 μm-10 μm. In some embodiments, if the second metal layer 122 has a thickness in the range of 0.2 μm-0.4 μm, the resistance value of the second metal layer 122 in a unit area (1 cm×1 cm) may be set in the range of 15 mΩ-200 mΩ, and preferably may be set to 30 mΩ.

Furthermore, in addition to the sputtering process, the first metal layer 121 may be formed by other processes, for example, one or more processes of chemical plating, physical vapor deposition, chemical vapor deposition, evaporation plating, sputtering plating, electroplating and hybrid plating. This embodiment is not limited to the process for forming the first metal layer 121. In some embodiments, the first metal layer 121 is formed by the sputtering process.

In the embodiment shown in FIG. 8, when the identification code is to be formed by ablation, laser energy forms a hollowed-out pattern on the first film layer, so that the color of the first metal layer 121 is exposed, and therefore the grayscale value corresponding to the color of the first metal layer 121 is lower than the grayscale value corresponding to the color of the second metal layer 122. For example, in some embodiments, the first metal layer 121 is selected to be Ag, and the second metal layer 122 is selected to be Ni.

Figure 9:
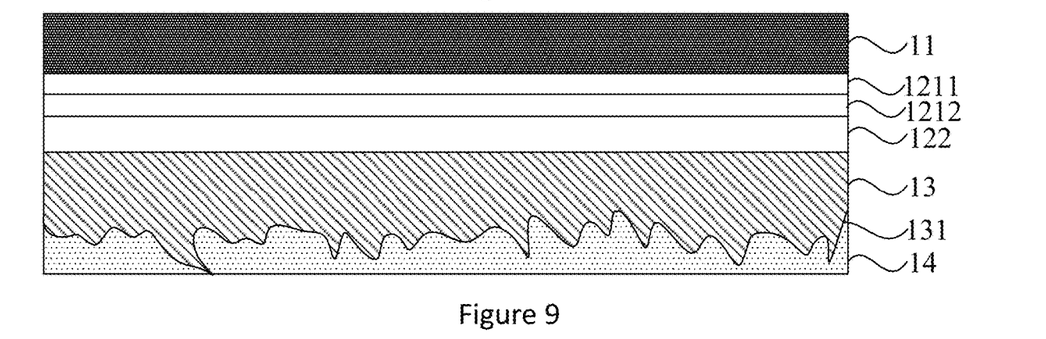
FIG. 9 is a schematic structural diagram of another shielding film according to an embodiment of the present disclosure.

FIG. 9 is a schematic structural diagram of another shielding film according to an embodiment of the present disclosure. In the embodiments, the first metal layer may include a first sputtered metal layer 1211 and a second sputtered metal layer 1212. The first sputtered metal layer 1211 is disposed between the first film layer 11 and the second sputtered metal layer 1212. The grayscale value of the color of the first sputtered metal layer 1211 is greater than the grayscale value of the color of the second sputtered metal layer 1212.

In this embodiment, two sputtered metal layers are disposed. When the first film layer 11 is ablated to form a hollowed-out pattern of an identification code, the laser energy may penetrate the first sputtered metal layer 1211, so that the second sputtered metal layer 1212 is used to increase the security and maintain a sputtered metal layer exposed the hollowed-out pattern have a higher flatness. Furthermore, the grayscale value of the color of the first sputtered metal layer 1211 may be set to be greater than the grayscale value of the color of the second sputtered metal layer 1212. For example, the first sputtered metal layer 1211 may be set to be silver, the second sputtered metal layer 1212 may be set to be nickel, and the metal surface of silver may form a sharp color contrast with the dark first film layer 11 to improve the clarity of the identification code.

Figure 10:
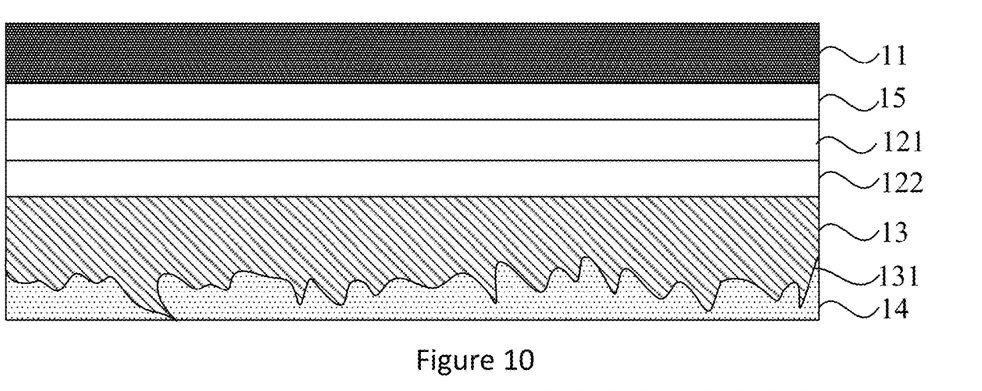
FIG. 10 is a schematic structural diagram of another shielding film according to an embodiment of the present disclosure.

FIG. 10 is a schematic structural diagram of another shielding film according to an embodiment of the present disclosure. In the embodiment, the contrast structural layer 12 further include a second film layer 15. The second film layer 15 is disposed between the first film layer 11 and the first metal layer 121. The difference between the grayscale value of the color of the second film layer 15 and the grayscale value of the color of the first film layer 11 is greater than or equal to a first grayscale threshold. The first grayscale threshold is greater than or equal to 10. The second film layer 15 is disposed between the first film layer 11 and the first metal layer 121. When the first metal layer 121 includes a first sputtered metal layer and a second sputtered metal layer, the second film layer 15 is disposed between the first film layer 11 and the first sputtered metal layer, so as to further enhance the protection of the first metal layer 121. Illustratively, by the second film layer 15, the situation where the laser energy may penetrate the first sputtered metal layer is completely avoided, and the first sputtered metal layer is protected. Then the grayscale value of the color of the second film layer 15 also needs to be greater than the grayscale value of the first film layer 11, and the difference between the grayscale value of the second film layer 15 and the grayscale value of the color of the first film layer 11 is greater than or equal to a first grayscale threshold. The first grayscale threshold is greater than or equal to 10. Then the difference between the grayscale value of the color of the second film layer 15 and the grayscale value of the color of the first film layer 11 is at least 10, so that a relatively obvious difference of light and shade is formed between the second film layer 15 and the first film layer 11, and the accuracy rate of recognition of the identification code formed by the second film layer 15 and the first film layer 11 through an identification code recognition apparatus is improved. In some embodiments, the first grayscale threshold is 50 or 100. The contrast of light and shade between the second film layer 15 and the first film layer 11 is further increased, so as to improve the identification code recognition precision and accuracy. In some embodiments, the second film layer 15 may be white or colorless. The second film layer 15 may have a thickness in the range of 0.5 μm-30 μm. The white second film layer 15 is more intense than the dark first film layer 11 and tends to form a clearer identification code. And the second film layer 15 may be colorless, so that the color of the first metal layer 121 can be exposed by the hollowed-out pattern through the second film layer 15.

On the basis of the above-mentioned embodiment, an embodiment of the present disclosure also provides a shielding film. With continued reference to FIG. 1, the shielding film includes: a first film layer 11, a contrast structural layer 12 and an electromagnetic shielding layer 13.

The first film layer 11 is disposed on a first side of the electromagnetic shielding layer 13.

The contrast structural layer 12 is disposed on the first side of the electromagnetic shielding layer 13.

The grayscale value of the color of the contrast structural layer 12 is greater than the grayscale value of the color of the first film layer 11. In the contrast structural layer 12 and the first film layer 11, a hollowed-out pattern of an identification code is formed on the layer further away from the electromagnetic shielding layer 13.

In the embodiment of the present disclosure, a shielding film includes an electromagnetic shielding layer for shielding EMI. A first film layer and a contrast structural layer are disposed on a first side of the electromagnetic shielding layer. The first film layer may be disposed between the electromagnetic shielding layer and the contrast structural layer, or the contrast structural layer may be disposed between the electromagnetic shielding layer and the first film layer. The grayscale value of the color of the contrast structural layer is required to be greater than the grayscale value of the color of the first film layer, so that an obvious brightness contrast of light and shade can be formed between the contrast structural layer and the first film layer.

In this embodiment, a hollowed-out pattern of an identification code is formed on the layer further away from the electromagnetic shielding layer in the contrast structural layer and the first film layer. Therefore, under the strong contrast of light and shade or colors between the contrast structural layer and the first film layer of the shielding film, a user can acquire an identification code with a higher definition, so that the identification code recognition precision and accuracy are improved, and a component or an electronic product identified by the identification code is easily traced.

In some embodiments, the identification code includes at least one of a bar code, a QR code and a character. The identification code is a unique corresponding recognition mark for identifying components or electronic products. The identification code may include a character pattern such as a number and a letter, and may also be a bar code or a QR code, and the shielding film of this embodiment may include at least one of the above-mentioned bar code, QR code and character to identify a corresponding component or electronic product. Illustratively, if the shielding film needs to be attached to a printed circuit board of an electronic device, an identification code of a component may be set at the position of the shielding film corresponding to the component. In some embodiments, the shielding film is provided with a plurality of identification codes in one-to-one correspondence with a plurality of components, so as to solve the problem that the printed identification code is unclear due to the identification code being set on the electronic product without a steel plate of sufficient size, thereby effectively improving the resolution and recognition precision of the identification code. In some embodiments, the hollowed-out pattern is formed by laser ablation. For example, the hollowed-out pattern may be ablated by using an ultraviolet laser and a carbon dioxide laser.

It is to be noted that when ablating the above-mentioned hollowed-out pattern, there may be two cases.

In the first case, in the contrast structural layer 12 and the first film layer 11, only the layer further away from the electromagnetic shielding layer 13 is burnt through to form a hollowed-out pattern of an identification code, but the layer near the electromagnetic shielding layer 13 is not ablated. That is, the ablation depth of the hollowed-out pattern is: the thickness of the layer further away from the electromagnetic shielding layer 13 in the contrast structural layer 12 and the first film layer 11. Then the hollowed-out pattern just exposes an unetched layer structure near the electromagnetic shielding layer 13, and the contrast structural layer 12 and the first film layer 11 form an identification code.

In the second case, while the layer further away from the electromagnetic shielding layer 13 in the contrast structural layer 12 and the first film layer 11 is burnt through to form a hollowed-out pattern of an identification code, the layer near the electromagnetic shielding layer 13 may be partially ablated. In this embodiment, the layer near the electromagnetic shielding layer 13 is partially ablated, but not completely ablated, and after the ablation of the identification code is completed, the hollowed-out pattern can also expose the layer near the electromagnetic shielding layer 13 in the contrast structural layer 12 and the first film layer 11, so that the contrast structural layer 12 and the first film layer 11 form the identification code. Specifically, in the contrast structural layer 12 and the first film layer 11, a groove pattern is formed on the layer near the electromagnetic shielding layer 13, and a vertical projection of the hollowed-out pattern on the plane where the electromagnetic shielding layer is located completely coincides with the groove pattern. A groove pattern is formed by partially ablating the layer near the electromagnetic shielding layer 13 in the contrast structural layer 12 and the first film layer 11, and since the above-mentioned groove pattern and hollowed-out pattern are formed by the same process, the vertical projection of the hollowed-out pattern on the plane where the electromagnetic shielding layer is located completely coincides with the groove pattern.

In some embodiments, with continued reference to FIG. 3, the contrast structural layer 12 is disposed on the side of the first film layer 11 further away from the electromagnetic shielding layer 13. The contrast structural layer 12 forms a hollowed-out pattern of an identification code. In this embodiment, when the contrast structural layer 12 is ablated to form a hollowed-out pattern of an identification code, only the contrast structural layer 12 is ablated without ablating the first film layer 11; or, when the contrast structural layer 12 is ablated to form a hollowed-out pattern of an identification code, the first film layer 11 is partially ablated at the same time to form a groove pattern, and the vertical projection of the hollowed-out pattern on the plane where the electromagnetic shielding layer is located completely coincides with the groove pattern.

As shown in FIG. 3, the material of the contrast structural layer 12 in this embodiment is metal. The grayscale value of the color of the metal is greater than the grayscale value of the color of the first film layer 11, and the difference between the grayscale value of the color of the metal and the grayscale value of the color of the first film layer 11 is greater than or equal to 10.

In some embodiments, the contrast structural layer 12 is an adhesive layer or an ink layer. The contrast structural layer 12 may be an adhesive layer or an ink layer having the grayscale value greater than that of the first film layer 11. While protecting the electromagnetic shielding layer 13, the contrast structural layer 12 forms a clear identification code with the first film layer 11 exposed by the hollowed-out pattern. In this embodiment, the adhesive layer is a thermosetting adhesive.

In some embodiments, the contrast structural layer 12 is a white adhesive layer or a white ink layer. In this embodiment, when the contrast structural layer 12 is a white adhesive layer or a white ink layer, the grayscale value of the color of the contrast structural layer 12 is 255, while the color of the first film layer 11 is black, the grayscale value of the color of the first film layer 11 is 0, and the contrast of black and white is strong, so that a clearer identification code is easily formed. Furthermore, the adhesive layer or the ink layer may have other colors with a high grayscale value, such as gray and yellow. This is not limited in this embodiment.

In some embodiments, with continued reference to FIG. 1, the first film layer 11 may also be disposed on the side of the contrast structural layer 12 further away from the electromagnetic shielding layer 13. The first film layer 11 forms a hollowed-out pattern of an identification code. In this embodiment, when the first film layer 11 is ablated to form a hollowed-out pattern of an identification code, only the first film layer 11 is ablated without ablating the contrast structural layer 12; or, when the first film layer 11 is ablated to form a hollowed-out pattern of an identification code, the contrast structural layer 12 is partially ablated at the same time to form a groove pattern, and the vertical projection of the hollowed-out pattern on the plane where the electromagnetic shielding layer is located completely coincides with the groove pattern. Optionally, the contrast structural layer 12 may be one or a combination of two or more of an adhesive layer, an ink layer and a metal layer.

Optionally, the contrast structural layer 12 may be an adhesive layer or an ink layer, and the grayscale value of the color of the adhesive layer or the ink layer is greater than the grayscale value of the color of the first film layer 11, and the difference between the grayscale value of the color of the adhesive layer or the ink layer and the grayscale value of the color of the first film layer 11 is greater than or equal to 10. In some embodiments, the contrast structural layer 12 is a white or colorless adhesive layer; or, the contrast structural layer 12 is a white ink layer. The material of the contrast structural layer 12 is selected from at least one of modified epoxy resin, modified acrylic, modified rubber, modified thermoplastic polyimide, modified polyester, thermoplastic resin, thermosetting resin, and pressure-sensitive adhesive. In this embodiment, when the contrast structural layer 12 is a white adhesive layer or a white ink layer, the grayscale value of the color of the contrast structural layer 12 is 255, while the grayscale value of the color of the first film layer 11 is preferably 0, and the contrast of black and white is strong, so that a clearer identification code is easily formed. Furthermore, the adhesive layer or the ink layer may have other colors with a low grayscale value, such as gray and yellow. This is not limited in this embodiment. It is to be noted that when the contrast structural layer 12 is disposed between the first film layer 11 and the electromagnetic shielding layer 13, a colorless adhesive layer is selected as the contrast structural layer 12, and the colorless adhesive layer effectively protects the electromagnetic shielding layer 13 and prevents the electromagnetic shielding layer 13 from being exposed in the hollowed-out pattern. Moreover, the contrast structural layer 12 is colorless, so that the electromagnetic shielding layer 13 is exposed through a hollowed-out pattern. The black of the first film layer 11 likewise forms a contrast with the color of the electromagnetic shielding layer 13 to form a relatively clear identification code. If the material selected for the electromagnetic shielding layer 13 is copper, the color of the electromagnetic shielding layer 13 is red copper, which is easily distinguished from black. The copper is effectively protected by the colorless contrast structural layer 12 so as to prevent the color from being not easily distinguished from that of the first film layer 11 subsequently due to oxidization by exposure in air.

Optionally, the contrast structural layer 12 may also be a metal layer. The grayscale value of the color of the metal is greater than the grayscale value of the color of the first film layer 11, and in some embodiments, the difference is greater than or equal to 10. In the embodiments, the material of the contrast structural layer 12 is at least one elementary substance of nickel, silver, platinum, titanium, aluminum, cobalt, and chromium; or, the material of the contrast structural layer is an alloy formed by at least two of nickel, silver, platinum, titanium, aluminum, cobalt, and chromium; or, the material of the contrast structural layer is a combination of alloys formed by at least two of nickel, silver, platinum, titanium, aluminum, cobalt, and chromium. It will be readily appreciated that an identification code with a sharper contrast between black and white is preferred, and therefore the color of the metal material of the contrast structural layer 12 is required to be light. A silver or silver-white metal material is provided in some embodiments. In this embodiment, at least one elementary substance of nickel, silver, platinum, titanium, aluminum, cobalt, and chromium is selected; or, an alloy formed by at least two of nickel, silver, platinum, titanium, aluminum, cobalt, and chromium forms the contrast structural layer 12; or, the material of the contrast structural layer is a combination of alloys formed by at least two of nickel, silver, platinum, titanium, aluminum, cobalt, and chromium. The above-mentioned materials are all white, silver or a color close to silver. As an example, nickel may be selected as the material of the contrast structural layer 12 in this embodiment, or a nickel-chromium alloy may be selected as the material of the contrast structural layer 12. Furthermore, the contrast structural layer 12 may be another light-colored metal having a low grayscale value. This is not limited in this embodiment.

In some embodiments, the contrast structural layer 12 includes a first metal layer 121 and a second metal layer 122. The first metal layer 121 is formed on the side of the first film layer 11 near the electromagnetic shielding layer 13 by a sputtering process. The second metal layer 122 is formed on the side of the first metal layer 121 further away from the first film layer 11 by an electroplating process.

In addition to the limitation of grayscale values, this embodiment also has certain requirements for the flatness of the contrast structural layer 12. As the surface of the contrast structural layer 12 is rougher, light on the surface of the contrast structural layer 12 is darker, and the resolution with respect to the first film layer 11 is reduced. Therefore, the contrast structural layer 12 is divided into two layers in this embodiment. That is, a first metal layer 121 is first formed on the first film layer 11 through a sputtering process, and a dense and flat metal surface is formed by the sputtering process, so as to facilitate the contrast with the first film layer 11. Then, a second metal layer 122 is formed on the flat first metal layer 121 through an electroplating process. In some embodiments, the first metal layer 121 may have a thickness in the range of 10 Å-2 μm, and the second metal layer 122 may have a thickness in the range of 0.1 μm-10 μm. In some embodiments, if the second metal layer 122 has a thickness in the range of 0.2 μm-0.4 μm, the resistance value of the second metal layer 122 in a unit area (1 cm×1 cm) may be set in the range of 15 mΩ-200 mΩ, and may be set to 30 mΩ in the embodiments.

In the embodiment shown in FIG. 7, when the identification code is to be formed by ablation, laser energy forms a hollowed-out pattern on the first film layer, so that the color of the first metal layer is exposed, and therefore the grayscale value corresponding to the color of the first metal layer is lower than the grayscale value corresponding to the color of the second metal layer. For example, the first metal layer may be selected to be Ag, and the second metal layer may be selected to be Ni.

As shown in FIG. 9, in the embodiments, the first metal layer includes a first sputtered metal layer 1211 and a second sputtered metal layer 1212. The first sputtered metal layer 1211 is disposed between the first film layer 11 and the second sputtered metal layer 1212. The grayscale value of the color of the first sputtered metal layer 1211 is greater than the grayscale value of the color of the second sputtered metal layer 1212.

In this embodiment, two sputtered metal layers are disposed. When the first film layer 11 is ablated to form a hollowed-out pattern of an identification code, the laser energy may penetrate the first sputtered metal layer 1211, so that the second sputtered metal layer 1212 is used to increase the security and maintain a sputtered metal layer with a higher flatness is exposed through the hollowed-out pattern. Furthermore, the grayscale value of the color of the first sputtered metal layer 1211 may be set to be greater than the grayscale value of the color of the second sputtered metal layer 1212. For example, the first sputtered metal layer 1211 is set to be silver, the second sputtered metal layer 1212 is set to be nickel, and the metal surface of silver forms a sharp color contrast with the dark first film layer 11 to improve the clarity of the identification code.

Figure 11:
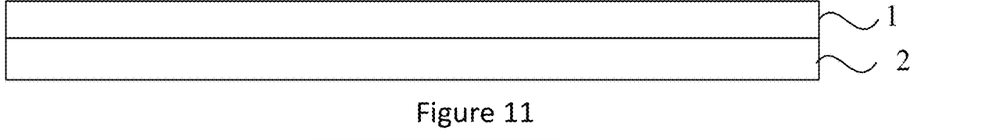
FIG. 11 is a schematic structural diagram of a circuit board according to an embodiment of the present disclosure.

Based on the same concept, an embodiment of the present disclosure also provides a circuit board. As shown in FIG. 11, FIG. 11 is a schematic structural diagram of a circuit board according to an embodiment of the present disclosure. The circuit board includes a printed circuit board 2 and a shielding film 1 provided by any embodiment of the present disclosure. An adhesive film layer is disposed on the side of an electromagnetic shielding layer of the shielding film 1 further away from the first film layer. The side of the adhesive film layer of the shielding film 1 is attached to the printed circuit board 2. The circuit board of this embodiment includes the technical features of the shielding film provided by any embodiment of the present disclosure, and has the beneficial effects of the shielding film provided by any embodiment of the present disclosure.

The printed circuit board 2 is integrated with a large number of components with different functions, and in this embodiment, an identification code of the component is set on the shielding film 1 at a position corresponding to the component. The shielding film 1 may cover the above-mentioned printed circuit board in a whole layer for achieving electromagnetic shielding in a whole layer. The shielding film 1 may also include a plurality of sub-shielding films with a smaller size, and each sub-shielding film is configured to cover a corresponding region of the printed circuit board. This is not limited in this embodiment. Furthermore, an identification code of an electronic device in which the circuit board is located may be set on the shielding film 1. Illustratively, the identification code of the electronic device is set on an edge region of the shielding film 1.

Figure 12:
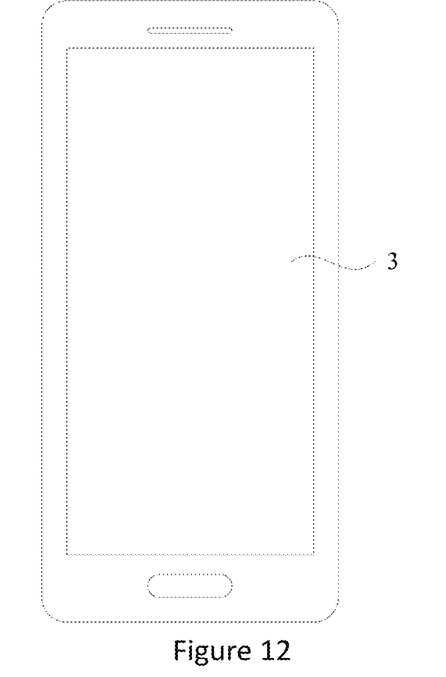
FIG. 12 is a schematic structural diagram of an electronic device according to an embodiment of the present disclosure.

An embodiment of the present disclosure also provides an electronic device. FIG. 12 is a schematic structural diagram of an electronic device according to an embodiment of the present disclosure. As shown in FIG. 12, the electronic device provided by the embodiment of the present disclosure includes a circuit board 3 according to any embodiment of the present disclosure. The electronic device may be a mobile phone as shown in FIG. 12, or a computer, a television, an intelligent wearable device, etc. This is not particularly limited in this embodiment.

It is to be noted that the foregoing is only illustrative of the preferred embodiments and technical principles of the present disclosure. It will be appreciated by those skilled in the art that the present disclosure is not limited to the particular embodiments described herein, and that various obvious changes, rearrangements and substitutions can be made by those skilled in the art without departing from the protection scope of the present disclosure. Therefore, although the present disclosure has been described in considerable detail with reference to the above embodiments, the present disclosure is limited to not only the above embodiments, but also more other equivalent embodiments without departing from the concept of the present disclosure, and the scope of the present disclosure is determined by the scope of the appended claims.

What is claimed is:

1. A shielding film, comprising: a first film layer, a contrast structural layer and an electromagnetic shielding layer, the first film layer being disposed on a first side of the electromagnetic shielding layer,
the contrast structural layer being disposed on the first side of the electromagnetic shielding layer,
wherein the grayscale value of the color of the contrast structural layer is greater than the grayscale value of the color of the first film layer.

2. The shielding film as claimed in claim 1, further comprising: an adhesive film layer,
the adhesive film layer being disposed on a side of the electromagnetic shielding layer away from the first film layer.

3. The shielding film as claimed in claim 2, wherein the side of the electromagnetic shielding layer near the adhesive film layer is roughened to form a plurality of protruding structures;
the protruding structures are configured to pierce the adhesive film layer and to be connected with a ground terminal of a printed circuit board.

4. The shielding film as claimed in claim 2, wherein the adhesive film layer is provided with a plurality of conductive particles;
the conductive particles are configured to pierce the adhesive film layer so as to be connected with a ground terminal of the printed circuit board and the electromagnetic shielding layer.

5. The shielding film as claimed in claim 1, wherein a difference value between the grayscale value of the color of the contrast structural layer and the grayscale value of the color of the first film layer is greater than or equal to a first grayscale threshold, the first grayscale threshold being greater than or equal to 10.

6. The shielding film as claimed in claim 1, wherein the contrast structural layer is disposed on a side of the first film layer away from the electromagnetic shielding layer.

7. The shielding film as claimed in claim 6, wherein the contrast structural layer is an adhesive layer or an ink layer.

8. The shielding film as claimed in claim 6, wherein the contrast structural layer is a metal layer.

9. The shielding film as claimed in claim 8, wherein the contrast structural layer comprises at least two metal layers.

10. The shielding film as claimed in claim 8, wherein the contrast structural layer further comprises: a second film layer disposed between the first film layer and the metal layer;
a difference value between the grayscale value of the color of the second film layer and the grayscale value of the color of the first film layer is greater than or equal to a first grayscale threshold, the first grayscale threshold being greater than or equal to 10.

11. The shielding film as claimed in claim 1, wherein the first film layer is disposed on a side of the contrast structural layer away from the electromagnetic shielding layer.

12. The shielding film as claimed in claim 11, wherein the contrast structural layer is an adhesive layer or an ink layer.

13. The shielding film as claimed in claim 1, wherein the electromagnetic shielding layer is provided with a plurality of through holes.

14. A circuit board, comprising: a printed circuit board and a shielding film as claimed in claim 1, wherein an adhesive film layer is disposed on a side of the electromagnetic shielding layer of the shielding film away from the first film layer;
one side of the adhesive film layer of the shielding film is attached to the printed circuit board.

15. A shielding film, comprising: a first film layer, a contrast structural layer and an electromagnetic shielding layer, the first film layer being disposed on a first side of the electromagnetic shielding layer, the contrast structural layer being disposed on the first side of the electromagnetic shielding layer, wherein the grayscale value of the color of the contrast structural layer is greater than the grayscale value of the color of the first film layer, and in the contrast structural layer and the first film layer, a hollowed-out pattern of an identification code is formed on a layer away from the electromagnetic shielding layer.

16. The shielding film as claimed in claim 15, wherein in the contrast structural layer and the first film layer, a groove pattern is formed on a layer near the electromagnetic shielding layer, and a vertical projection of the hollowed-out pattern on a plane where the electromagnetic shielding layer is located completely coincides with the groove pattern.

17. The shielding film as claimed in claim 15, wherein the contrast structural layer is disposed on a side of the first film layer away from the electromagnetic shielding layer, and the contrast structural layer forms the hollowed-out pattern of the identification code.

18. The shielding film as claimed in claim 17, wherein the contrast structural layer is an adhesive layer or an ink layer.

19. The shielding film as claimed in claim 15, wherein the first film layer is disposed on a side of the contrast structural layer away from the electromagnetic shielding layer, and the first film layer forms the hollowed-out pattern of the identification code.

20. The shielding film as claimed in claim 19, wherein the contrast structural layer is one or a combination of two or more of an adhesive layer, an ink layer and a metal layer.

* * * * *